(12) United States Patent
Morita

(10) Patent No.: US 8,836,378 B2
(45) Date of Patent: Sep. 16, 2014

(54) DIRECT SAMPLING CIRCUIT

(75) Inventor: Tadashi Morita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 19 days.

(21) Appl. No.: 13/805,842

(22) PCT Filed: Jun. 29, 2011

(86) PCT No.: PCT/JP2011/003709
§ 371 (c)(1),
(2), (4) Date: Dec. 20, 2012

(87) PCT Pub. No.: WO2012/008106
PCT Pub. Date: Jan. 19, 2012

(65) Prior Publication Data
US 2013/0099828 A1    Apr. 25, 2013

(30) Foreign Application Priority Data
Jul. 15, 2010 (JP) ................. 2010-160721

(51) Int. Cl.
*G11C 27/02* (2006.01)
*H03K 5/00* (2006.01)
*H03K 17/00* (2006.01)

(52) U.S. Cl.
USPC .......................................... 327/94; 327/554

(58) Field of Classification Search
USPC ................... 327/91, 94, 95, 554, 553
See application file for complete search history.

(56) References Cited

U.S. PATENT DOCUMENTS

| | | | |
|---|---|---|---|
| 5,973,536 A | 10/1999 | Maejima | |
| 7,979,047 B2* | 7/2011 | Miyano et al. | 455/334 |
| 8,229,987 B2* | 7/2012 | Hosokawa et al. | 708/313 |
| 2003/0083033 A1 | 5/2003 | Staszewski et al. | |
| 2008/0002597 A1* | 1/2008 | Fan et al. | 370/280 |
| 2009/0009155 A1 | 1/2009 | Hosokawa et al. | |
| 2010/0182077 A1 | 7/2010 | Hosakawa et al. | |
| 2010/0311375 A1* | 12/2010 | Hosokawa et al. | 455/227 |

FOREIGN PATENT DOCUMENTS

| | | |
|---|---|---|
| CN | 101689862 A | 3/2010 |
| JP | 56-78895 A | 6/1981 |
| JP | 06-232755 A | 8/1994 |
| JP | 07-249989 A | 9/1995 |
| JP | 09-83301 A | 3/1997 |
| WO | 2007/102459 A1 | 9/2007 |
| WO | 2009/004818 A1 | 1/2009 |

OTHER PUBLICATIONS

International Search Report for PCT/JP2011/003709 dated Sep. 27, 2011.

* cited by examiner

*Primary Examiner* — Quan Tra
(74) *Attorney, Agent, or Firm* — Pearne & Gordon, LLP

(57) ABSTRACT

Provided is a direct sampling circuit in which signal mixing between systems is avoided, even when signal systems in which time sharing is integrated are used together by time sharing. History capacitors (153, 155) are connected at a preceding step to a switched capacitor filter (160) for each system, buffer capacitors (173, 175) are connected at a subsequent step to the switched capacitor filter (160) for each system, and the history capacitors and buffer capacitors, which are connected to a rotation capacitor of the switched capacitor filter (160), are switched for each time-sharing system that is input.

6 Claims, 10 Drawing Sheets

US 8,836,378 B2

DIRECT SAMPLING CIRCUIT

TECHNICAL FIELD

The present invention relates to a direct sampling circuit for performing a direct sampling process on input signals subjected to combination by time division (hereinafter, referred to as "time-division combination").

BACKGROUND ART

A configuration is disclosed for directly sampling high frequency signals on a discrete-time basis and performing a reception process on the result, in order to achieve reductions in size and power consumption of a radio receiver and integration of an analog signal processing section and a digital signal processing section (e.g., see Patent Literature 1).

An example configuration and operation of a discrete-time direct sampling circuit using a conventional discrete-time process will be described with reference to FIG. 1. FIG. 1 shows the discrete-time direct sampling circuit as a whole. The discrete-time direct sampling circuit includes voltage current converter (TA) 1, sampling switch 2, history capacitor ($C_H$) 3, rotation capacitors 4a to 4h, buffer capacitor ($C_B$) 5, dump switch 6, reset switch 7, integral switches 8a to 8h, release switches 9a to 9h, and digital control unit 10.

Voltage current converter (TA) 1 converts received radio frequency (RF) signals into current, and outputs the current as analog RF current signals. Sampling switch 2 is composed of, for example, PET, and samples received analog RF current signals depending on input of local frequency signal (LO).

History capacitor ($C_H$) 3 accumulates electric charge supplied by the current output from sampling switch 2. Rotation capacitors 4a to 4h are each connected in parallel to both history capacitor 3 and buffer capacitor 5 via several switches. In addition, each of rotation capacitors 4a to 4h consists of rotation capacitor ($C_R$) for accumulating or discharging the electric charge in response to "on" or "off" controls of the switches.

Buffer capacitor ($C_B$) 5 is commonly connected to a plurality of rotation capacitors 4 to buffer charge signals by sharing the electric charge accumulated in capacitors 4. Dump switch 6 turns on or off connections between respective rotation capacitors 4a to 4h and buffer capacitor 5. After the electric charge shared with buffer capacitor 5, reset switch 7 grounds the electric charge accumulated in rotation capacitor 4.

A group of integral switches 8a to 8h consists of a plurality of integral switches. In addition, integral switches 8a to 8h turn on or off connections between history capacitor 3 and respective rotation capacitors 4a to 4h. A group of release switches 9a to 9h consists of a plurality of release switches. In addition, release switches 9a to 9h turn on or off connections between respective rotation capacitors 4a to 4h and buffer capacitor 5.

Dump switch 6, reset switch 7, integral switches 8a to 8h, and release switches 9a to 9h are composed of (n type) FETs, for example. The n-type FET is turned on (electrically conducted) at high gate voltage (hereinafter, referred to as "high state"), and is turned off (disconnected) at a low gate voltage. (hereinafter, referred to as "low state").

Digital control unit 10 generates control signals and supplies the control signals to integral switches 8a to 8h, release switches 9a to 9h, dump switch 6, and reset switch 7.

In this case, eight rotation capacitors $C_R$ are provided in the discrete-time direct sampling circuit as an example. Eight integral switches 8a to 8h and eight release switches 9a to 9h are also provided. After each component number, "a" to "h" are attached in alphabetical order. In fact, the discrete-time direct sampling circuit can have a configuration for performing differential operation, and such a configuration is disclosed in Patent Literature 1. However, for simplification of explanation, the description will be omitted.

FIG. 2 is a timing diagram of the control signals generated by digital control unit 10. Local frequency signal (LO) is supplied to the gate of sampling switch 2. Control signals S1 to S8 are supplied to the gates of integral switches 8a to 8h, respectively. Control signal SAZ is supplied to the gates of release switches 9a to 9d. Control signal SBZ is supplied to the gates of release switches 9e to 9h. Control signal D is supplied to the gate of dump switch 6, and control signal R is supplied to the gate of reset switch 7.

An operation of the discrete-time direct sampling circuit shown in FIG. 1 will now be described. Voltage current converter 1 converts received analog RF signals into analog RF current signals and outputs the result to sampling switch 2. Sampling switch 2 samples the analog RF current signals based on local frequency signal LO having the almost same frequency as the analog RF current signals. The signals sampled based on local frequency signal LO is turned into discrete signals, which is timely discrete, through charge integration in history capacitor 3 and rotation capacitors 4a to 4h.

History capacitor 3 and one of rotation capacitors 4a to 4h define parallel-connected capacitors. Such capacitors can integrate the discrete signals over a longer time than the clock length of local frequency signal LO. Consequently, a filtering process and decimation are performed.

To be more specific, the discrete-time direct sampling circuit first turns on integral switch 8a by control signal S1, and then connects rotation capacitor 4a to history capacitor 3. The electric charge, which is supplied to the two types of capacitors during the high state of control signal S1 (for example, for eight periods of local frequency signal LO), is integrated.

During the low state of control signal S1, history capacitor 3 is disconnected from rotation capacitor 4a and then is connected to rotation capacitor 4b by control signal S2. Rotation capacitor 4b integrates the electric charge supplied by current of the discrete signals during the high state of control signal S2, and then is disconnected from history capacitor 3. In the same way, rotation capacitors 4c to 4h are connected in sequence to history capacitor 3 every eight periods of local frequency signal LO by control signals S3 to S8, respectively. Thus, the two types of capacitors integrate the electric charge supplied by the current of the discrete signals.

As described above, the discrete-time direct sampling circuit integrates electric charge, which is supplied by current of discrete signals for eight periods of local frequency signal LO. Consequently, the discrete-time direct sampling circuit can achieve filtering characteristics of a finite impulse response (FIR) filter composed of eight taps. In addition, integrating signals in the eight periods of local frequency signal LO can obtain the amount of electric charge for one sample, and thus the sampling rate is decimated into one-eighth. A function section to achieve this filtering characteristics is referred to as "first FIR filter."

Additionally, the discrete-time direct sampling circuit connects rotation capacitors 4a to 4h in sequence to history capacitor 3 to achieve filtering characteristics of an infinite impulse response (IIR) filter. A function section to achieve this filtering characteristics is referred to as "first IIR filter."

Next, control signal SAZ turns on release switches 9a to 9d to electrically conduct rotation capacitors 4a to 4d to buffer capacitor 5. Thus, the electric charge accumulated in rotation capacitors 4a to 4d is shared with buffer capacitor 5. As a result, the electric charge of rotation capacitors 4a to 4d partially moves to and accumulates into buffer capacitor 5.

After rotation capacitors 4a to 4d and buffer capacitor 5 share the electric charge, control signal D turns off dump switch 6 to dissolve the state of sharing the electric charge. Next, control signal R turns on reset switch 7, and then grounding resets the remaining electric charge in rotation capacitors 4a to 4d.

By this means, the discrete-time direct sampling circuit can achieve the filtering characteristics of a FIR filter composed of four taps, by partially moving the electric charge accumulated in rotation capacitors 4a to 4d to buffer capacitor 5 to combine the moved electric charge. The discrete-time direct sampling circuit combines discrete signals for four samples into discrete output signals for one sample, and then the sampling rate is decimated into a quarter.

Similarly, control signal SBZ turns on release switches 9c to 9h, and rotation capacitors 4e to 4h partially share the electric charge accumulated therein with buffer capacitor 5. Accordingly, the discrete-time direct sampling circuit achieves filtering characteristics of the FIR filter composed of four taps and the quarter decimation. The circuit having such filtering characteristics is referred to as "second FIR filter."

In addition, the discrete-time direct sampling circuit allows each group of rotation capacitors 4a to 4d and 4e to 4h to alternately share the electric charge with buffer capacitor 5, to achieve the IIR filtering characteristics. The circuit having such filtering characteristics is referred to as "second IIR filter."

FIG. 3 shows the filtering characteristics described above. In this case, the frequency of local frequency signal LO is 2.4 GHz, the capacitance of history capacitor 3 is 15 pF, the capacitance of each of the rotation capacitors 4a to 4h is 0.5 pF, and the capacitance of buffer capacitor 5 is 15 pF. The transconductance of voltage current converter 1 is 7.5 mS.

FIG. 3A shows filtering characteristics of the first FIR filter, and FIG. 3 shows filtering characteristics of the first IIR filter. FIG. 3C shows filtering characteristics of the second FIR filter, and FIG. 3D shows filtering characteristics of the second IIR filter. FIG. 3E shows filtering characteristics of the whole discrete-time direct sampling circuit, and FIG. 3F shows an expanded view of the frequency range in the vicinity of 2.4 GHz in the filtering characteristics of FIG. 3E. In the FIGs, the DC gain is normalized with 0 dB.

As described above, the discrete-time direct sampling circuit combines filtering characteristics of the first FIR filter, the first IIR filter, the second FIR filter, and the second IIR filter, and outputs signals subjected to a filtering process of the combined characteristics, to a circuit in a subsequence stage.

CITATION LIST

Patent Literature

PTL 1

U.S. Patent Application Publication No. 2003/0035499, specification, "Direct Radio Frequency Sampling with Recursive Filtering Method"

SUMMARY OF INVENTION

Technical Problem

Current systems, such as multiple input multiple output (MIMO), maximum ratio combining (MRC), and a diversity, each requires a plurality of high frequency sections. In order to reduce the circuit scale, such systems are required to use a high frequency section (or high frequency sections) by time division to share a circuit.

However, sharing by time division of a conventional direct sampling circuit shown in FIG. 1 generally has the following problem on operation having filtering effect on signals subjected to time-division combination. In other words, the conventional direct sampling circuit causes a mix of the signals between individual streams, making it difficult to separate its output into individual streams. Additionally, when the signals subjected to time-division combination is processed, a direct sampling circuit having IIR filtering effect causes a mix of the signals between individual streams, making it difficult to perform desired direct sampling operation.

It is an object of the present invention to provide a direct sampling circuit for preventing signals from being mixed between individual streams even when signal sequences subjected to time-division combination are processed by sharing the direct sampling circuit by time-division.

Solution To Problem

A direct sampling circuit of the present invention employs a configuration including: a switched capacitor filter that performs filtering on signals generated by combining by time division input signals of a plurality of streams into a single-stream signal; history capacitors that are placed in a preceding stage of the switched capacitor filter for individual streams and are connected to rotation capacitors in the switched capacitor filter for individual streams targeted for filtering; buffer capacitors that are placed in a subsequent stage of the switched capacitor filter for individual streams and are connected to rotation capacitors in the switched capacitor filter for individual streams targeted for filtering; and a separation section that separates the signals subjected to the filtering for individual streams.

Advantageous Effects of Invention

According to the present invention, it is possible to prevent signals from being mixed between individual streams even when signal sequence subjected to time-division combination are processed by sharing the direct sampling circuit by time-division.

DESCRIPTION OF EMBODIMENT

Figure 1:
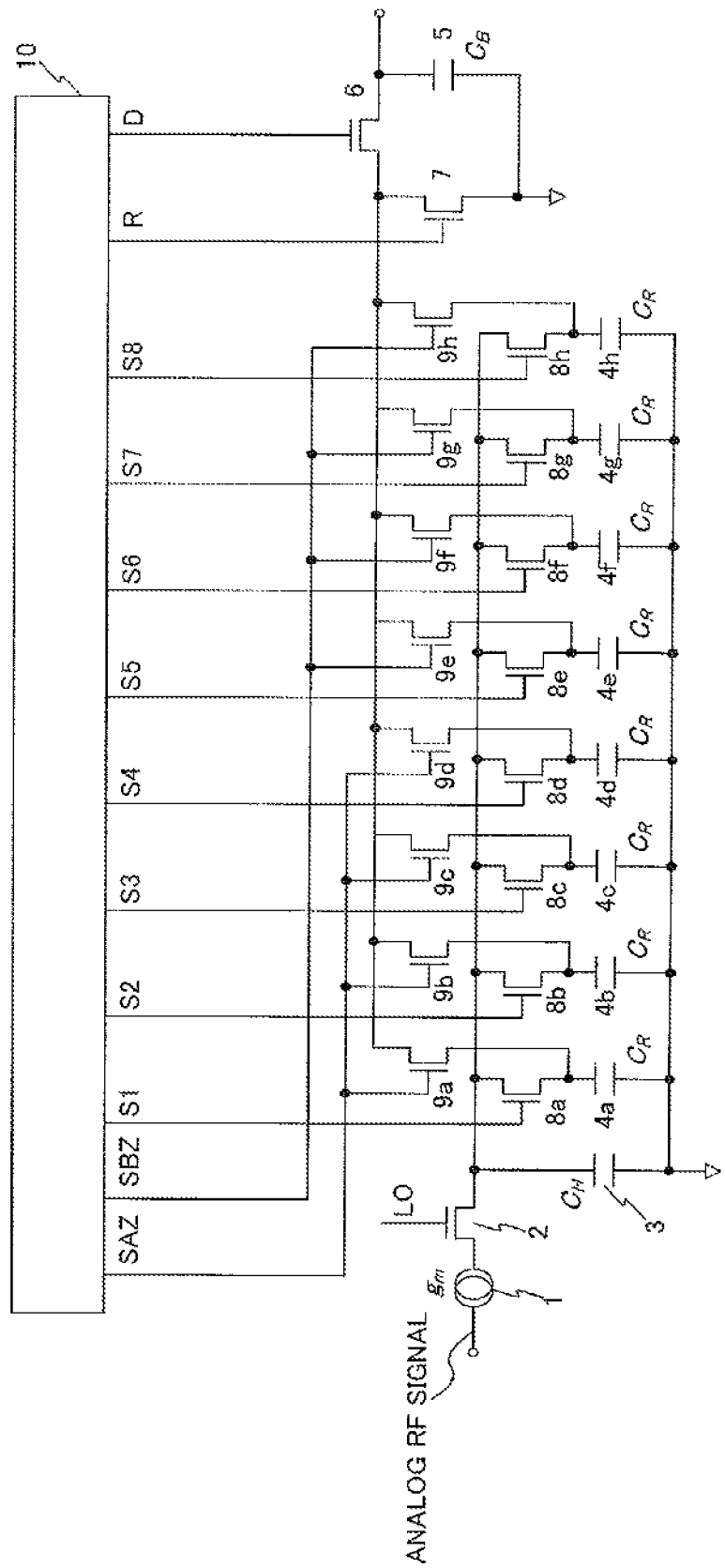
FIG. 1 shows a configuration of a conventional discrete-time direct sampling circuit.
Figure 2:
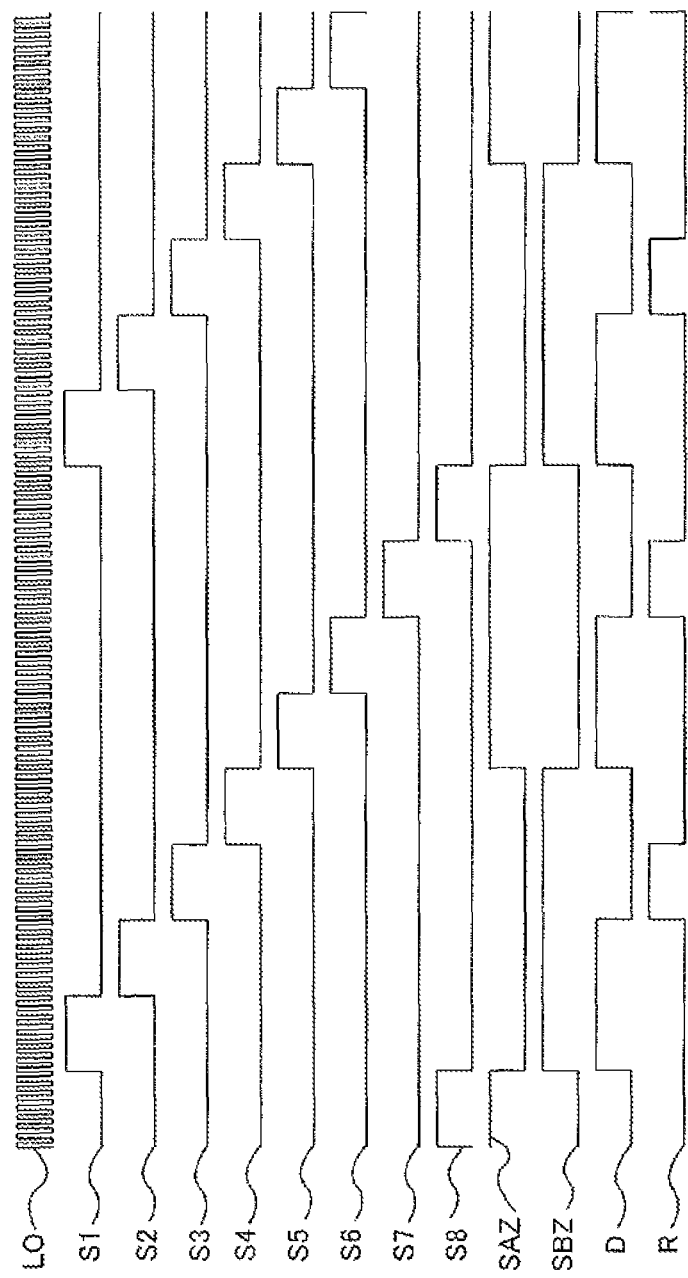
FIG. 2 is a timing diagram for explanation of control signals generated by a digital control unit shown in FIG. 1.
Figure 3A:
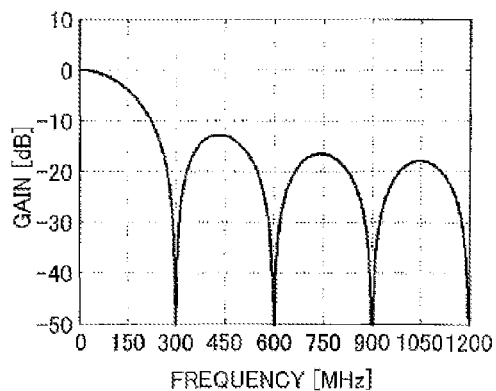
FIG. 3 is a diagram for showing example filtering characteristics achieved by the conventional discrete-time direct sampling circuit.
Figure 3B:
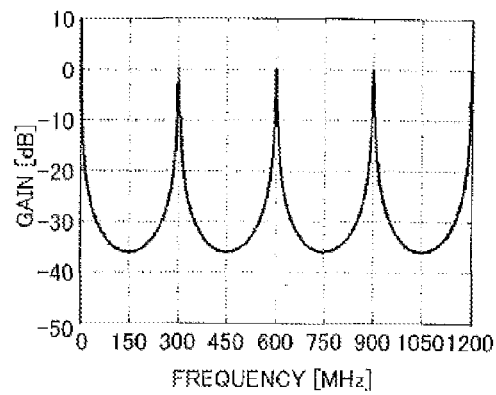
Figure 3C:
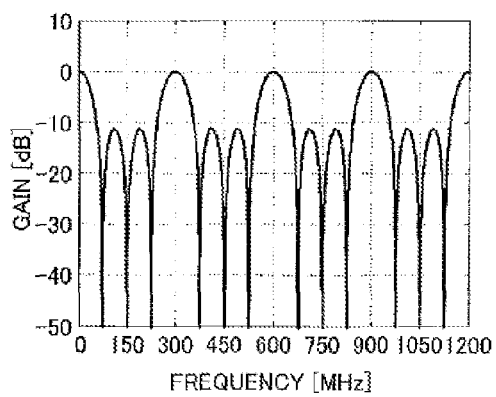
Figure 3D:
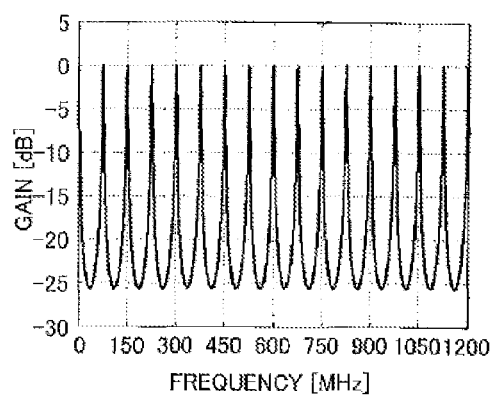
Figure 3E:
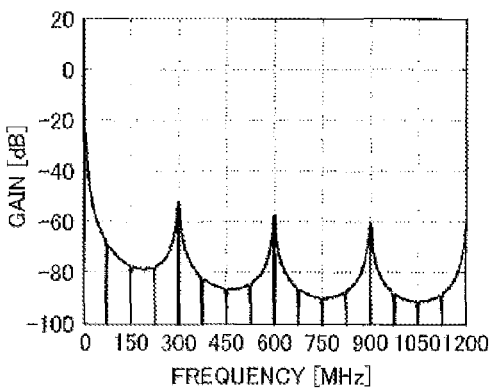
Figure 3F:
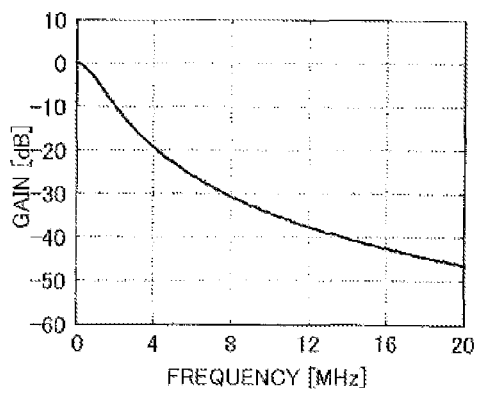

Embodiments of the present invention will be described in detail with reference to the accompanying drawings. However, components having the same function will be assigned the same reference numerals in the embodiments and duplicated descriptions thereof will be omitted.

Embodiment 1

Figure 4:
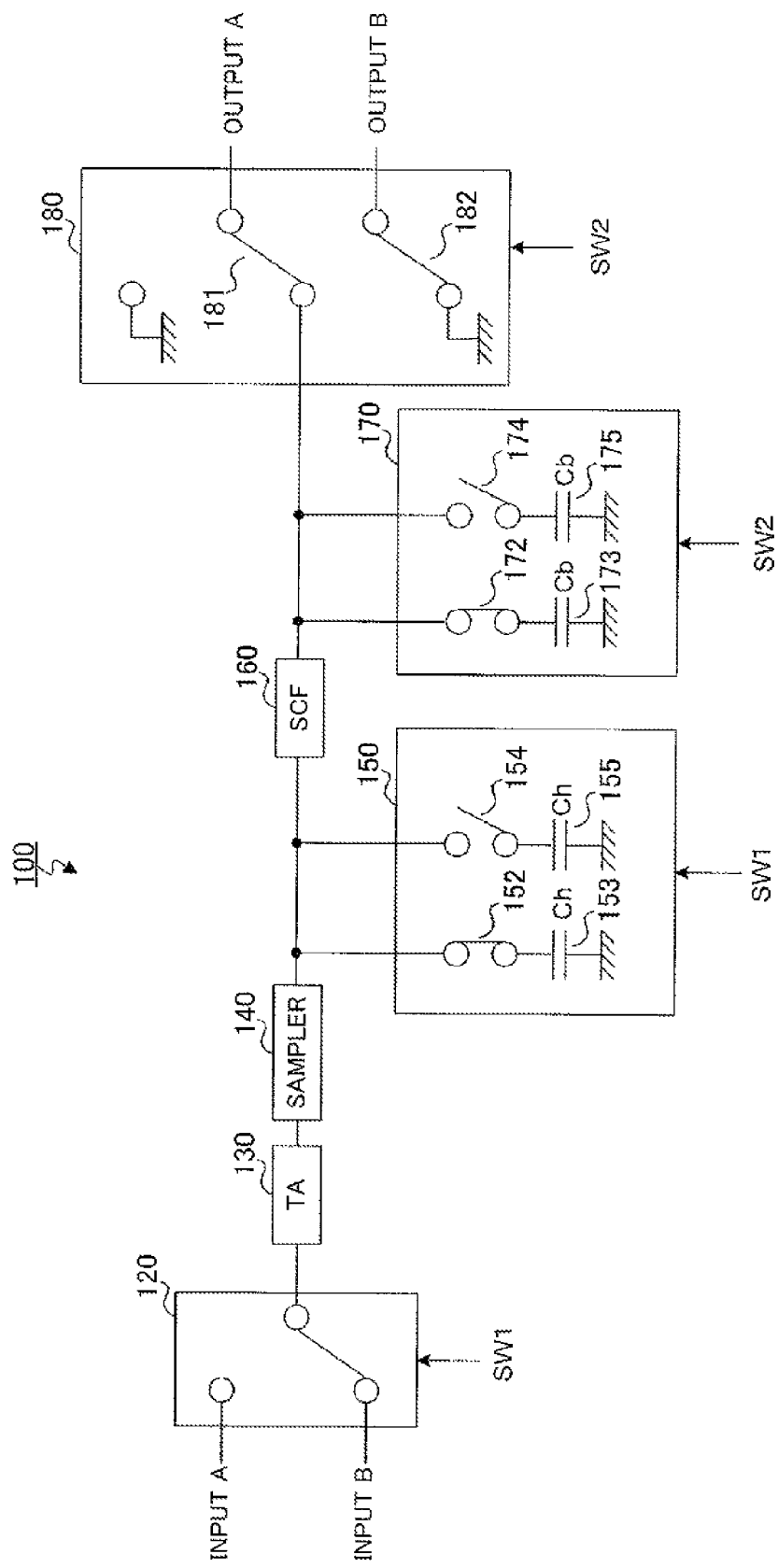
FIG. 4 shows a configuration of a time-division direct sampling mixer according to Embodiment 1 of the present invention.

FIG. 4 shows a configuration of a time-division direct sampling mixer (hereinafter, referred to as "time-division direct sampling mixer (DSM)") 100 according to Embodiment 1 of the present invention. The configuration of time-division DSM 100 will now be described with reference to FIG. 4.

Time-division combining switch 120 switches two inputs, i.e., input A for inputting stream A and input B for inputting stream B, depending on selection signal SW1. Thus, time-division combining switch 120 combines by time division two streams, i.e., stream A and stream B, into a single-stream signal and outputs the result to transconductance amplifier (TA) 130.

Transconductance amplifier 130 converts the signals outputted from time-division combining switch 120 into current and outputs the current to sampler 140. Sampler 140 performs a sampling process on the signals outputted from transconductance amplifier 130 and down-converts the result. Sampler 140 outputs the down-converted signals to switched capacitor filter (SCF) 160.

Switched capacitor filter 160 repeats charge and discharge of rotation capacitors in response to input of four control signals S0, S1, S2, and S3 (not shown). Thus, switched capacitor filter 160 performs a filtering process on the signals outputted from sampler 140 and outputs the result to separation switch 180. Switched capacitor filter 160 will be described in detail later.

History capacitor section 150 is connected between sampler 140 and switched capacitor filter 160. In history capacitor section 150, history capacitors 153 and 155 having different capacitance corresponding to individual streams are connected via switches 152 and 154, respectively. Switches 152 and 154 switch the connection for individual streams depending on the input of selection signal SW1. Selection signal SW1 is the same as selection signal SW1 inputted to time-division combining switch 120.

Buffer capacitor section 170 is connected between switched capacitor filter 160 and separation switch 180. In buffer capacitor section 170, buffer capacitors 173 and 175 having different capacitance corresponding to individual streams are connected via switches 172 and 174, respectively. Switches 172 and 174 switch the connection for individual streams depending on the input of selection signal SW2.

This selection signal SW2 is generated by one time cycle of delay of selection signal SW1. This is because a filtering process performed by switched capacitor filter 160 causes one time cycle of constant delay of the output signals of switched capacitor filter 160 relative to the input signal.

Separation switch 180 separates the signals outputted from switched capacitor filter 160 into two streams, i.e., output A and output B, depending on selection signal SW2. Specifically, when selection signal SW2 selects output A, switch 181 is connected to an input node and switch 182 is connected to 0V. Meanwhile, when selection signal SW2 selects output B, switch 182 is connected to the input node, and switch 181 is connected to 0V. Selection signal SW2 is the same as selection signal SW2 inputted to buffer capacitor section 170.

Output A from separation switch 180 is signals in which zero padding is performed on input A subjected to a direct sampling process. In these signals, aliasing signals, which are generated by stream switching, are eliminated by an interpolation filter (not shown) prepared in a subsequent stage of separation switch 180, and desired band signals are extracted. Output B is processed similarly to output A.

Figure 5:
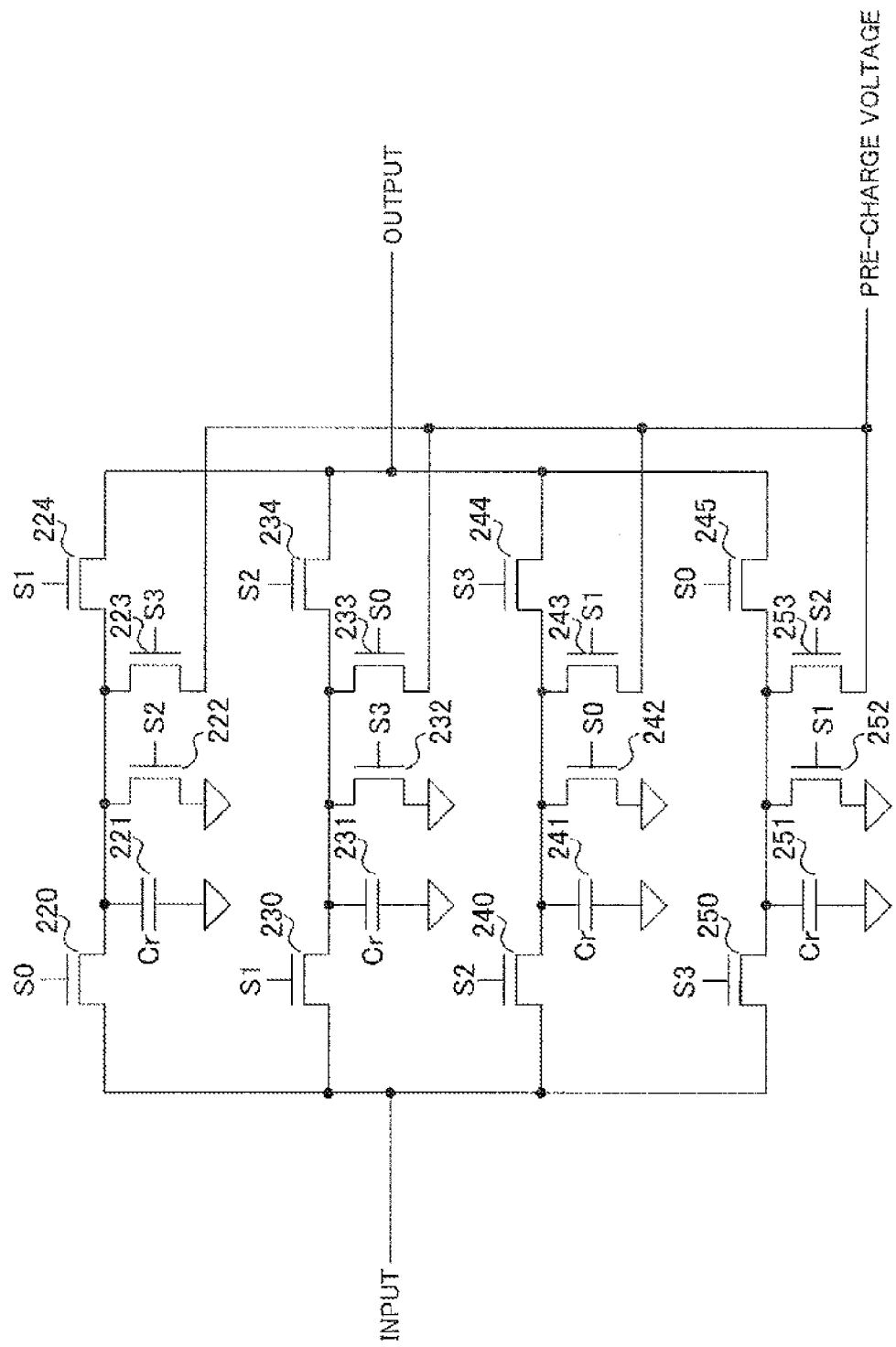
FIG. 5 shows an internal configuration of a switched capacitor filter shown in FIG. 4.
Figure 6:
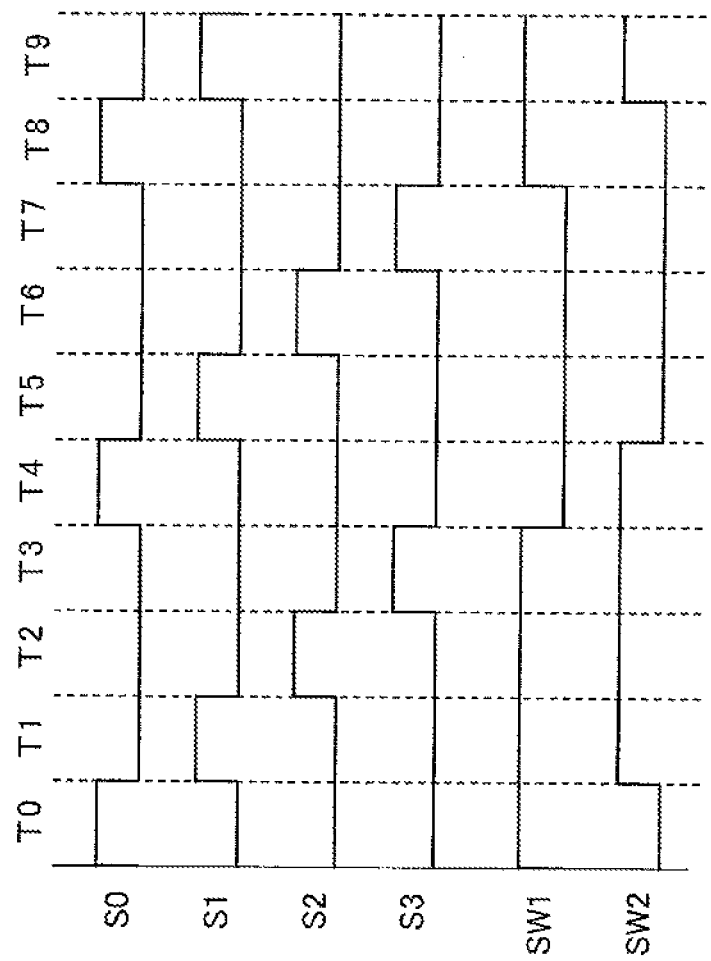
FIG. 6 is a timing diagram for explanation of control signals S0 to S3 and selection signals SW1 and SW2.

FIG. 5 shows an internal configuration of switched capacitor filter 160 shown in. FIG. 4. FIG. 6 is a timing diagram for explanation of control signals S0 to S3 and selection signals SW1 and SW2. An operation of switched capacitor filter 160 will now be described with reference to FIG. 5 and FIG. 6. This case explains branches of transistor switch (transistor SW) 240 to transistor SW244 as an example.

At time T0, only control signal S0 is in a high state to turn on transistor SW 242. This operation leads to entire discharge of the electric charge accumulated in rotation capacitor 241.

At time T1, only control signal S1 is in a high state to turn on transistor SW 243. This operation leads to accumulation of initial charge from pre-charge voltage into rotation capacitor 241.

At time T2, only control signal S2 is in a high state to turn on transistor SW 240. This operation leads to parallel connection of history capacitor 153 or 155 in a preceding stage of switched capacitor filter 160 to rotation capacitor 241. As a result, electric charge, which is generated by adding the initial charge prior to one time cycle and electric charge corresponding to the ratio of the capacitance of connected history capacitor (hereinafter, referred to as "history capacitance") Ch to the capacitance of connected rotation capacitor (hereinafter, referred to as "rotation capacitance") Cr, is accumulated in rotation capacitor 241.

At time T3, only control signal S3 is in a high state to turn on transistor SW 244. This operation leads to parallel connection of buffer capacitor 173 or 175 in a subsequent stage of switched capacitor filter 160 to rotation capacitor 241. As a result, the electric charge corresponding to the ratio of the capacitance of connected buffer capacitor (hereinafter, referred to as "buffer capacitance") Cb to rotation capacitance Cr is accumulated in rotation capacitor 241. At and after time T4, the processes from times T0 to T3 are repeated.

In branches of transistors SW 220 to 224, branches of transistors SW 230 to 234, and branches of transistors SW 250 to 254, the same processes are performed by shifting the time step.

As described above, history capacitor section 150 in a preceding stage of switched capacitor filter 160 shares electric charge with rotation capacitors in switched capacitor filter 160. Accordingly, switched capacitor filter 160 performs an IIR filtering operation. In the same way, buffer capacitor section 170 in a subsequent stage of switched capacitor filter 160 shares electric charge with the rotation capacitors in switched capacitor filter 160. Accordingly, switched capacitor filter 160 performs the IIR filtering operation. As a result, switched capacitor filter 160 defines a second-order IIR filter.

Selection signal SW1 must be synchronized with the control signals as shown in FIG. 6, and the lengths of high and low periods of selection signal SW1 must be a natural number multiple of the control signals. Each of high and low periods of selection signal SW1 consists of four time cycles. Selection signal SW2 is generated by one time cycle of delay of selection signal SW1, as described above.

Time-division DSM 100 according to the present embodiment causes aliasing signals due to stream switching in the output from separation switch 180. The aliasing signals must be eliminated by a filter prepared in a subsequent stage of separation switch 180. However, speeding-up of the operation of selection signal SW1 and selection signal SW2 increases the frequency generated by the aliasing signals. For this reason, time-division DSM 100 can ease requirements on characteristics of the filter required in a subsequent stage, by speeding-up of the operation of selection signal SW1 and selection signal SW2.

As described above, the IIR filtering characteristics achieved in time-division DSM 100 is determined by the ratio of history capacitance Ch included in history capacitor section 150 to rotation capacitance Cr defining switched capacitor filter 160. History capacitance Ch represents the capacitance of history capacitor 153 or 155. Rotation capacitance Cr represents the capacitance Cr of one of rotation capacitors 221, 231, 241, and 251. Alternatively, the IIR filtering characteristics achieved in time-division DSM 100 is determined by the ratio of buffer capacitance Cr included in buffer capacitor section 170 to rotation capacitance Cr defining switched capacitor filter 160. Buffer capacitance Cr represents the capacitance of buffer capacitor 173 or 175. Rotation capacitance Cr represents the capacitance Cr of one of rotation capacitors 221, 231, 241, and 251.

Consequently, compared to IIR filtering characteristics achieved by a general DSM, time-division DSM 100 according to the present embodiment can achieve the IIR filtering characteristics using history capacitance Ch (153 or 155) which is half of that of the general DSM, for one signal stream. In the same way, time-division DSM 100 according to the present embodiment can achieve the IIR filtering characteristics using buffer capacitance Cb (173 or 175) which is half of that of the general DSM, for one signal stream. That is, in order to achieve the same HR filtering effect as the general DSM, the sum of history capacitance Ch and that of buffer capacitance Cb required in time-division DSM using two streams by time division can be the same as those of the general DSM.

In the general DSM, circuit scales of history capacitance Ch and buffer capacitance Cb are large, and those circuits are the most dominant. Compared to this, time-division combining DSM 100 according to the present invention includes history capacitance Ch and buffer capacitance Cb having equivalent circuit scales to that of the general DSM, and can achieve a circuit for double streams.

As described above, time-division DSM 100 according to Embodiment 1, places history capacitors for individual streams in a preceding stage of a switched capacitor filter and buffer capacitors for individual streams in a subsequent stage of the switched capacitor filter, and thus switches the history capacitors and buffer capacitors connected to rotation capacitors of the switched capacitor filter for individual streams targeted for filtering. By this means, time-division DSM 100 can switch the IIR filtering characteristics for individual streams, and then prevent signals from being mixed between individual streams and reduce the circuit scale.

Since time-division DSM 100 uses one history capacitor and one buffer capacitor among a plurality of history capacitors and a plurality of buffer capacitors, respectively, power consumption can be reduced.

The present embodiment has been described in a case where active periods over which the IIR filtering operation is performed on two streams, i.e., stream A and stream B have the same length. However, the present invention is not limited to such an embodiment, and the active period of one of the two streams can be extended and that of the other can be shorten. For example, this situation is applicable to a case where one is important data and the other is unimportant data. Consequently, the gain for the important data can be enhanced. As an example of such data, in a diversity with two streams, one stream that has high performance is considered as important data and the other stream that does not have high performance is considered as unimportant data.

Embodiment 2

Figure 7:
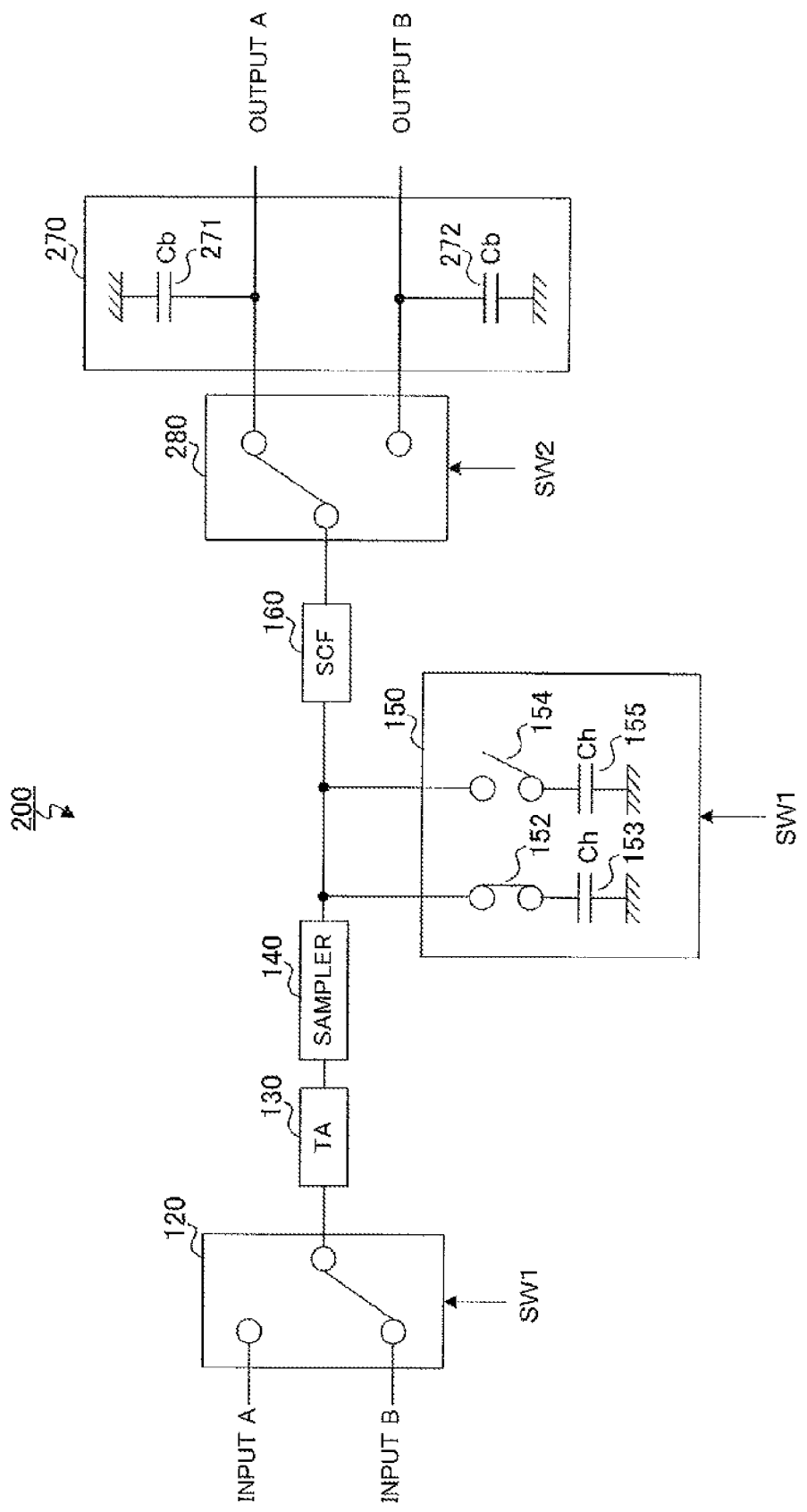
FIG. 7 shows a configuration of a time-division DSM according to Embodiment 2 of the present invention.

FIG. 7 shows is a configuration of time division DSM 200 according to Embodiment 2 of the present invention. FIG. 7 differs from FIG. 4 in that buffer capacitor section 170 is changed to buffer capacitor section 270 and separation switch 180 is changed to separation switch 280.

Depending on selection signal SW2, separation switch 280 separates the signal outputted from switched capacitor filter 160 into two streams, i.e., output A and output B. Specifically, when selection signal SW2 selects output A, separation switch 280 is connected to the node of output A. On the other hand, when selection signal SW2 selects output B, separation switch 280 is connected to the node of output B.

In buffer capacitor section 270, when separation switch 280 is connected to the node of output A, buffer capacitor 271 is connected to a rotation capacitor of switched capacitor filter 160. On the other hand, in buffer capacitor section 270, when separation switch 280 is connected to the node of output B, buffer capacitor 272 is connected to a rotation capacitor of switched capacitor filter 160. In each of these cases, buffer capacitor section 270 performs the IIR filtering characteristics.

According to the above configuration, the buffer capacitor at an output node that is not selected in separation switch 280 holds the electric charge, and the previously selected output voltage is maintained. As a result, the amplitudes of spectra of aliasing signals are reduced on the basis of spectra of desired waves contained in output A and output B. For this reason, time-division DSM 200 can further ease the characteristics required for the filter in the subsequent stage of time-division DSM 200.

As described above, time-division DSM 200 according to Embodiment 2 places a separation switch for separating signals for individual streams in a subsequent stage of a switched capacitor filter, and buffer capacitors for individual streams in a subsequent stage of the separation switch. Consequently, time-division DSM 200 can further ease the characteristics required for the filter in the subsequent stage of time-division DSM 200 and reduce the number of components for forming a circuit.

Embodiment 3

A configuration of a time-division DSM according to Embodiment 3 of the present invention is the same as the configuration of Embodiment 1 shown in FIG. 4 except for internal configurations of a history capacitor section and a buffer capacitor section.

Figure 8:
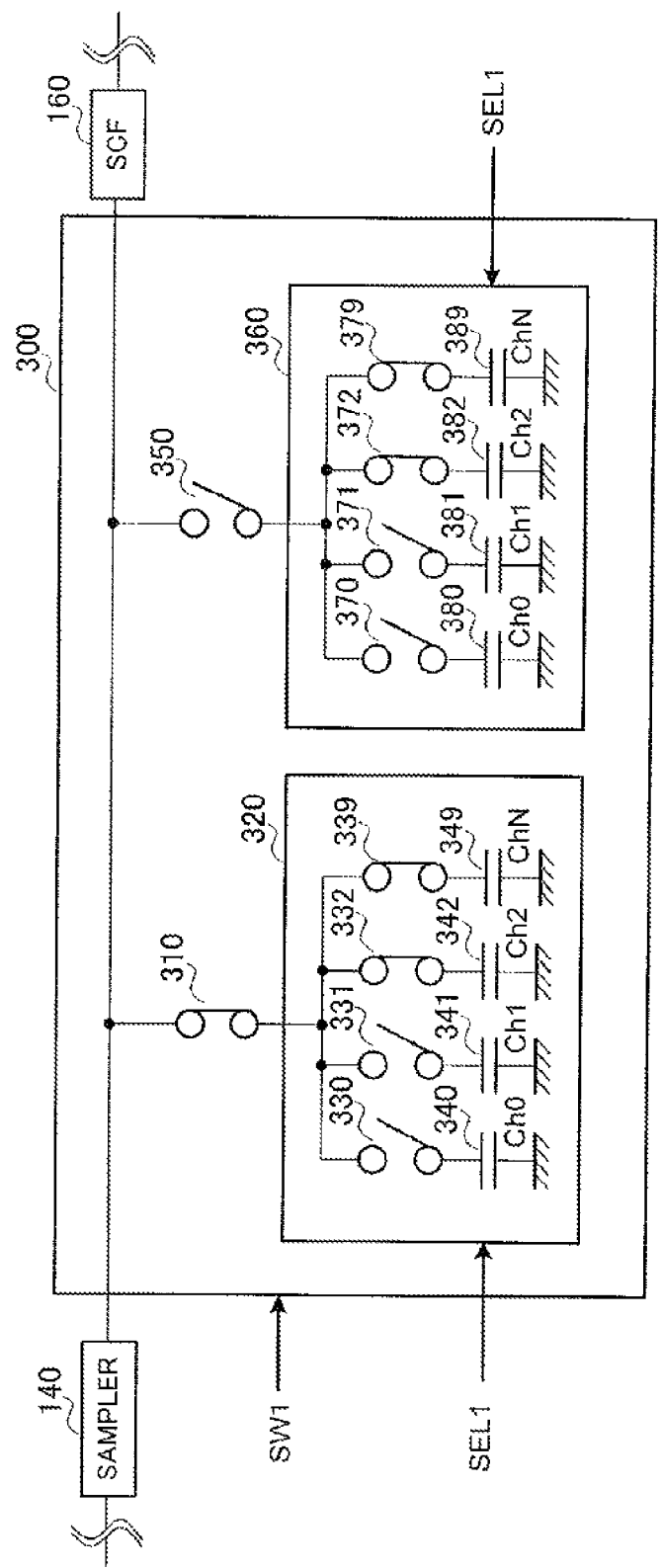
FIG. 8 shows an internal configuration of a history capacitor section according to Embodiment 3 of the present invention.

FIG. 8 shows an internal configuration of history capacitor section 300 according to Embodiment 3 of the present invention. The configuration of history capacitor section 300 will now be described with reference to FIG. 8. History capacitor section 300 includes history capacitor group 320 for the first stream, history capacitor group 360 for the second stream, and switches 310 and 350 for electrically conduct or disconnect those capacitors.

Switches 310 and 350 can exclusively switch the electrical conduction and the disconnection by selection signal SW1 that is received from the exterior.

In a configuration inside history capacitor group 320, N pairs are provided, each pair consisting of one switch and one history capacitor. The connection and disconnection of these N history capacitors are switched based on selection signal SEL1. Selection signal SEL1 is used for applying a direct sampling circuit to a variety of communication systems or fine-tuning the characteristics of the systems due to variations between individual components of the systems, for example. In addition, selection signal SEL1 is fixed and without a change during a certain communication period.

Since history capacitor group 360 is the same as history capacitor group 320, the detailed explanation will be omitted.

Figure 9:
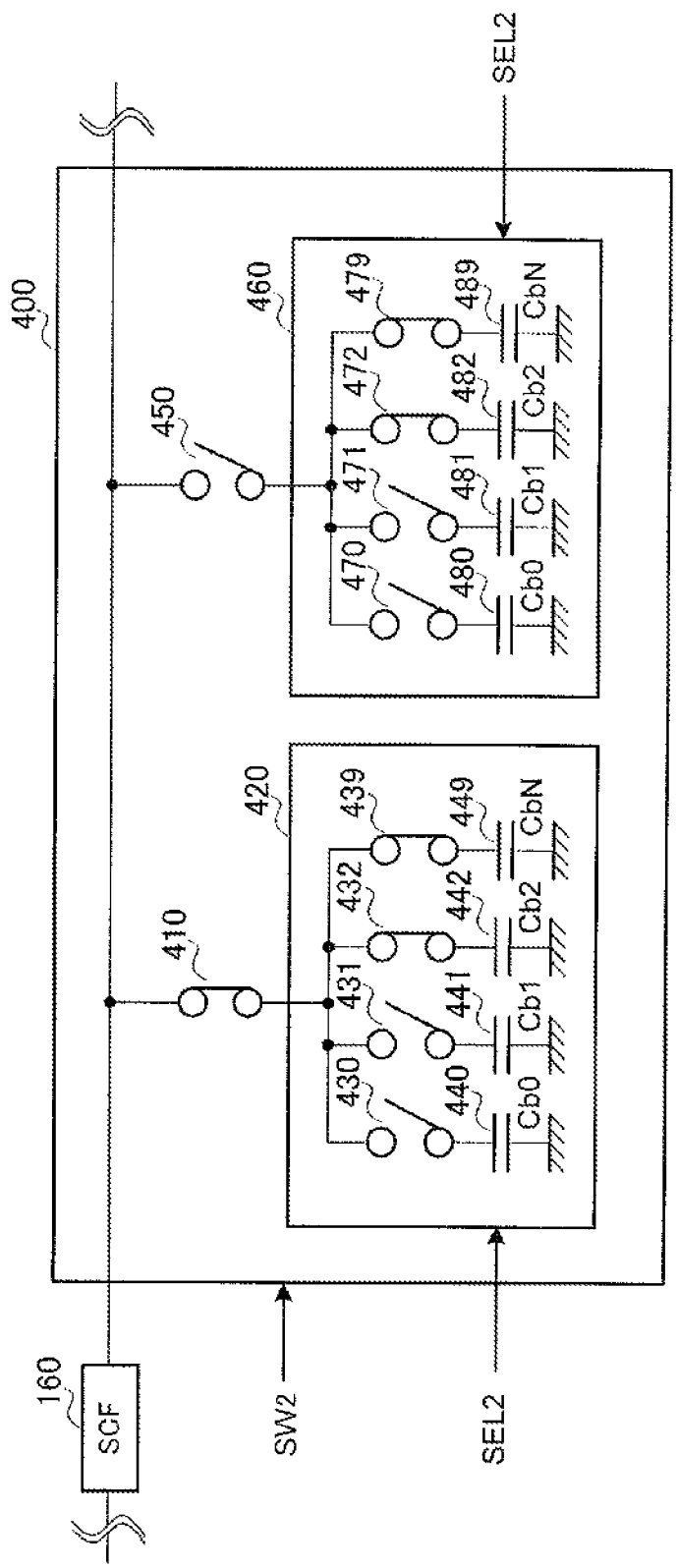
FIG. 9 shows an internal configuration of a buffer capacitor section according to Embodiment 3 of the present invention.

FIG. 9 shows an internal configuration of buffer capacitor section 400 according to Embodiment 3 of the present invention. The configuration of buffer capacitor section 400 will now be described with reference to FIG. 9. Buffer capacitor section 400 includes buffer capacitor group 420 for the first stream, buffer capacitor group 460 for the second stream, and switches 410 and 450 for electrically conduct or disconnect those capacitors.

Switches 410 and 450 can exclusively switch the electrical conduction and the disconnection each other by selection signal SW2 that is received from the exterior.

In a configuration inside buffer capacitor group 420, N pairs are provided, each pair consisting of one switch and one buffer capacitor. The connection and disconnection of these N buffer capacitors are switched based on selection signal SEL2. Like selection signal SEL1, selection signal SEL2 is used for fine tuning of the characteristics and is fixed without a change during a certain communication period.

Since buffer capacitor group 460 is the same as buffer capacitor group 420, the detailed explanation will be omitted.

The time-division DSM according to the present embodiment can suppress deterioration of filtering characteristics caused by adding capacitance components to signal lines and reduce, to a low level, the capacitance components directly added to the signal lines even when the each number of history capacitors and buffer capacitors is increased. By this means, the time-division DSM according to the present embodiment can suppress the deterioration of the filtering characteristics.

As described above, the time-division DSM according to Embodiment 3 includes, for individual streams, a plurality of history capacitors and a plurality of buffer capacitors, which are connected to a switched capacitor filter in preceding and subsequent stages, respectively, and selectively switches the history capacitors and the buffer capacitors. Consequently, the time-division DSM according to the present embodiment can be applied to a variety of communication systems and can fine-tune the characteristics of systems due to variations between individual components of the systems, for example.

Embodiment 4

A configuration of a time-division DSM according to Embodiment 4 of the present invention is the same as the configuration shown in FIG. 7 of Embodiment 2 except for an internal configuration of a buffer capacitor section.

Figure 10:
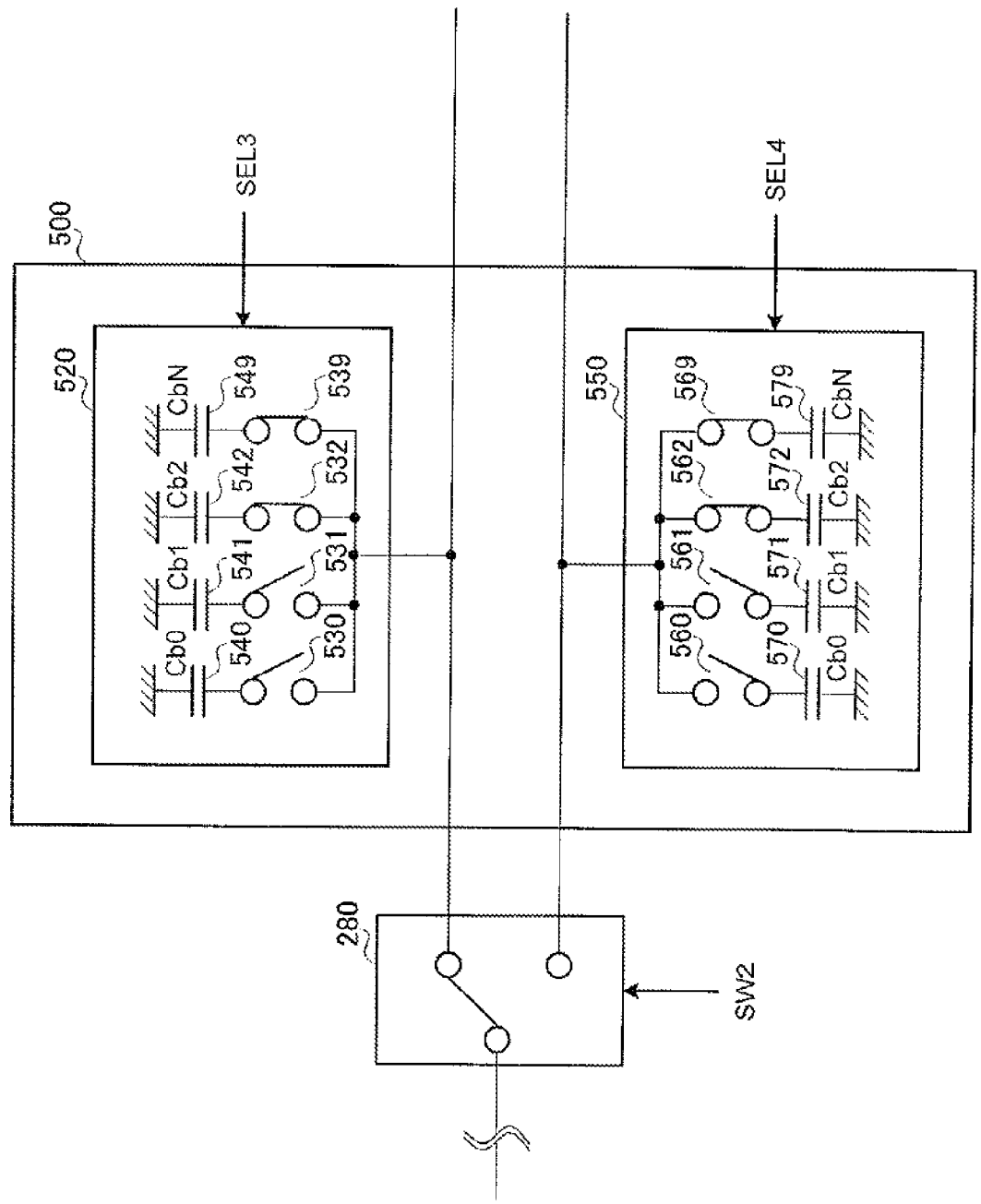
FIG. 10 shows an internal configuration of a buffer capacitor section according to Embodiment 4 of the present invention.

FIG. 10 shows an internal configuration of buffer capacitor section 500 according to Embodiment 4 of the present invention. The configuration of buffer capacitor section 500 will now be described with reference to FIG. 10. Buffer capacitor section 500 includes buffer capacitor group 520 for the first stream and buffer capacitor group 550 for the second stream.

In a configuration inside buffer capacitor group 520, N pairs are provided, each pair consisting of one switch and one buffer capacitor. The connection and disconnection of these N buffer capacitors are switched based on selection signal SEL3. Selection signal SEL3 is used for applying a direct sampling circuit to a variety of communication systems or fine-tuning the characteristics of the systems due to variations between individual components of the systems, for example. Selection signal SEL3 is fixed without a change during a certain communication period.

In a configuration inside buffer capacitor group 550, N pairs are provided, each pair consisting of one switch and one buffer capacitor. The connection and disconnection of these N buffer capacitors are switched based on selection signal SEL4. Like selection signal SEL3, selection signal SEL4 is used for fine tuning of the characteristics, and is fixed without a change during a certain communication period.

As described above, the time-division DSM according to Embodiment 4 places a separation switch for separating signals for individual streams in a subsequent stage of a switched capacitor filter, includes a plurality of buffer capacitors for individual streams in a subsequent stage of the separation switch, and selectively switches the buffer capacitors. Consequently, the time-division DSM according to the present embodiment can further ease characteristics required for the filter in a subsequent stage of the time-division DSM. In addition, the time-division DSM according to the present embodiment can be applied to a variety of communication systems and can fine-tune the characteristics of the systems due to variations between individual components of the systems, for example.

The disclosure of Japanese Patent Application No. 2010-160721, filed on Jul. 15, 2010, including the specification, drawings and abstract, is incorporated herein by reference in its entirety.

INDUSTRIAL APPLICABILITY

A direct sampling circuit according to the present invention is useful to prevent signals from being mixed between individual streams even when signal sequences subjected to time-division combination are processed by sharing a direct sampling circuit by time-division.

REFERENCE SIGNS LIST

120 Time-division combining switch
130 Transconductance amplifier
140 Sampler
150, 300 History capacitor section
152, 154, 172, 174, 181, 182, 310, 330, 331, 332, 339, 350, 370, 371, 372, 379, 410, 430, 431, 432, 439, 450, 470, 471, 472, 479, 530, 531, 532, 539, 560, 561, 562, 569 Switch
153, 155, 340, 341, 342, 349, 380, 381, 382, 389 History capacitor
160 Switched capacitor filter
170, 270, 400, 500 Buffer capacitor section
173, 175, 271, 272, 440, 441, 442, 449, 480, 481, 482, 489, 540, 541, 542, 549, 570, 571, 572, 579 Buffer capacitor
180, 280 Separation switch
220, 222, 223, 224, 230, 232, 233, 234, 240, 242, 243, 244, 250, 252, 253, 254 Transistor switch
221, 231, 241, 251 Rotation capacitor
320, 360 History capacitor group
420, 460, 520, 550 Buffer capacitor group

The invention claimed is:
1. A direct sampling circuit, comprising:
 a switched capacitor filter that performs filtering on signals generated by combining, by time division, input signals of a plurality of streams;

history capacitors that are placed in a preceding stage of the switched capacitor filter for individual streams of the plurality of streams and are switched for the individual streams targeted for filtering to be connected to rotation capacitors in the switched capacitor filter;

buffer capacitors that are placed in a subsequent stage of the switched capacitor filter for individual streams of the plurality of streams and are switched for the individual streams targeted for filtering to be connected to rotation capacitors in the switched capacitor filter; and a separation section that separates the signals subjected to the filtering for the individual streams.

2. The direct sampling circuit according to claim 1, wherein the buffer capacitors are placed in a subsequent stage of the separation section.

3. The direct sampling circuit according to claim 1, wherein a plurality of the history capacitors and a plurality of the buffer capacitors are placed for each of the individual streams of the plurality of streams and the connections thereof are selectively switched.

4. The direct sampling circuit according to claim 2, wherein a plurality of the buffer capacitors is placed for each of the individual streams of the plurality of streams and the connections thereof are selectively switched.

5. The direct sampling circuit according to claim 1, wherein:

the history capacitors have different capacitance for each of the individual streams of the plurality of streams; and the buffer capacitors have different capacitance for each of the individual streams of the plurality of streams.

6. The direct sampling circuit according to claim 1, further comprising a time-division combining section that combines, by time division, the input signals of the plurality of streams by a first selection signal, wherein:

the history capacitors are switched, by the first selection signal, for the individual streams targeted for filtering;

the buffer capacitors are switched, by a second selection signal, for the individual streams targeted for filtering; and the separation section separates, by the second selection signal, the signals generated by combining by time division for the individual streams.

* * * * *